US 6,633,793 B2

(12) United States Patent
Wu et al.

(10) Patent No.: US 6,633,793 B2
(45) Date of Patent: Oct. 14, 2003

(54) METHOD TO REDUCE LOT-TO-LOT VARIATION OF ARRAY THRESHOLD VOLTAGE IN A DRAM DEVICE

(75) Inventors: Joseph Wu, Hsinchu (TW); Hsiao-Li Wang, Tainan (TW)

(73) Assignee: ProMos Technologies, Hsin-Chu (TW)

( * ) Notice: Subject to any disclaimer, the term of this patent is extended or adjusted under 35 U.S.C. 154(b) by 145 days.

(21) Appl. No.: 09/928,061

(22) Filed: Aug. 13, 2001

(65) Prior Publication Data

US 2003/0033043 A1 Feb. 13, 2003

(51) Int. Cl.[7] .............................................. G09B 14/00
(52) U.S. Cl. ...................... 700/110; 700/109; 700/29; 700/31; 438/5; 437/52
(58) Field of Search ................................. 700/109, 110, 700/29, 31; 437/52; 438/5; 702/84

(56) References Cited

U.S. PATENT DOCUMENTS

| | | | |
|---|---|---|---|
| 5,408,405 A | * 4/1995 | Mozumder et al. | 700/31 |
| 5,721,152 A | * 2/1998 | Jenq et al. | 438/254 |
| 5,727,128 A | 3/1998 | Morrison | 395/10 |
| 5,841,676 A | 11/1998 | Ali et al. | 364/552 |
| 5,850,339 A | 12/1998 | Giles | 364/148 |
| 5,858,825 A | * 1/1999 | Alsmeier et al. | 438/224 |
| 5,862,054 A | 1/1999 | Li | 364/468.28 |
| 6,061,640 A | 5/2000 | Tanaka et al. | 702/81 |
| 6,213,848 B1 | * 4/2001 | Campbell et al. | 451/41 |
| 6,415,193 B1 | * 7/2002 | Betawar et al. | 700/97 |

* cited by examiner

Primary Examiner—Leo Picard
Assistant Examiner—Michael D Masinick
(74) Attorney, Agent, or Firm—George O. Saile; Stephen B. Ackerman; Douglas R. Schnabel

(57) ABSTRACT

A new method to reduce variation in an output parameter by selection of an optimal process recipe in the manufacture of an integrated circuit device is achieved. The method may be used to reduce the array voltage threshold in a DRAM circuit by compensating the source/drain ion implantation by calculating a predicted array voltage threshold. The integrated circuit device wafer is measured to obtain a present set of process parameter values. A predicted value of an output parameter is calculated by evaluating a first equation at the present set of process parameter values. The first equation is derived from a plurality of previous sets of process parameter values and the corresponding plurality of sets of output parameter values. The difference between the predicted value of the output parameter and a target value of the output parameter is the output parameter delta. A process recipe offset is calculated by evaluating a second equation at the output parameter delta. The second equation is derived from the plurality of selectable process recipes and the plurality of corresponding output parameter values. An optimal process recipe is selected from the plurality of selectable process recipes by adding the process recipe offset to the target process recipe to compensate the output parameter and to thereby reduce the variation.

20 Claims, 4 Drawing Sheets

METHOD TO REDUCE LOT-TO-LOT VARIATION OF ARRAY THRESHOLD VOLTAGE IN A DRAM DEVICE

BACKGROUND OF THE INVENTION (1) Field of the Invention

The invention relates to a method to reduce lot-to-lot variation in a DRAM device, and more particularly, to a method to reduce lot-to-lot variation of array voltage threshold ($V_t$) by optimal selection of a process recipe in the manufacture of an integrated circuit device.

(2) Description of the Prior Art

DRAM memory circuits are a basic building block in many electronic systems. A DRAM memory contains an array of densely-packed transistors with each transistor containing a charge storage capacitor. Precise control of the voltage threshold ($V_t$) of the array transistors is critical to producing quality DRAM circuits. Unfortunately, technology shrinkage makes the $V_t$ value more difficult to control because lot-to-lot variations in any of several processing parameters can cause substantial variation in the $V_t$ value.

Referring now to FIG. 1, a top view of a section of a prior art DRAM memory circuit is shown. In this view, an active area 20 is formed in the semiconductor substrate. Gate conductor lines 24 are patterned such that they overlie the active area 20 to thereby form transistors. Deep trenches 28 are etched into the semiconductor substrate for deep trench capacitor storage nodes. A bit line contact 32 is made to provide connectivity between the active area 20 and the bit line, not shown.

Referring now to FIG. 2, a cross section of the prior art DRAM cell is shown. Note particularly that the deep trenches 28 are formed adjacent to the source and drain regions 38. Shallow trench isolations (STI) 27 define the non-active areas. Sidewall spacers 36 and a capping layer 40 are used to complete the transistor gates formed by the gate conductor lines 24. The bit line contact opening 32 through the overlying insulating layer 44 allows the bit line metal 48 to electrically contact the active area 38.

It is important to note that several features in the prior art DRAM cell could potentially affect the $V_t$ value for the device. It is found, for example, that variation in the width of the active area 20 critical dimension, also called the active area CD, can cause variation in the $V_t$ value.

Several prior art approaches disclose methods or apparatus for controlling, monitoring, or modeling manufacturing processes for integrated circuits. U.S. Pat. No. 5,862,054 to Li teaches a method to collect, display, and archive statistical process control (SPC) data. A manufacturing information system (MIS) is used for data storage and retrieval. The SPC system monitors, but does not control, the manufacturing process. U.S. Pat. No. 6,061,640 to Tanaka et al teaches a method and an apparatus to analyze manufacturing data. Processing data and product data are analyzed using a multistage, multivariate analysis unit. Abnormal factors are extracted. The method provides a quality analysis tool but does not control the manufacturing process. U.S. Pat. No. 5,850,339 to Giles discloses a data analysis technique for optimizing a set of independent variables to best achieve a desired set of dependent variables. An iterative scoring system is disclosed wherein a high score indicates improved optimization. U.S. Pat. No. 5,841,676 to Ali et al teaches a system and a method to estimate the change point time in a manufacturing process under SPC. An exponential weighted moving average (EWMA) is used to detect a change point time. A diagnostic analysis is used to identify sources of process change. U.S. Pat. No. 5,727,128 to Morrison discloses a system and a method to automatically determine which process variables should be included in a process model. The method uses a regression analysis on the set of potential model input variables and then selects the variables to use based on a selection criteria. However, the method does not provide manufacturing process control.

SUMMARY OF THE INVENTION

A principal object of the present invention is to provide a very manufacturable method to reduce variation in an output parameter in the manufacture of an integrated circuit device.

A further object of the present invention is to reduce lot-to-lot output parameter variation by optimally selecting a processing recipe based on parametric value measurements.

A yet further object is to select an optimal processing recipe by calculating a predicted output parameter value and then shifting the target processing recipe value to compensate for the predicted variation.

Another further object of the present invention is to reduce the threshold voltage variation of a DRAM array by compensating the source/drain ion implantation recipe based on a threshold voltage prediction calculation.

In accordance with the objects of this invention, a new method to reduce variation in an output parameter by selection of an optimal process recipe in the manufacture of an integrated circuit device is achieved. The method may be used to reduce the array voltage threshold in a DRAM circuit by compensating the source/drain ion implantation by calculating the predicted array voltage threshold. The integrated circuit device wafer is measured to obtain a present set of process parameter values. A predicted value of an output parameter is calculated by evaluating a first equation at the present set of process parameter values. The first equation is derived from a plurality of previous sets of process parameter values and the corresponding plurality of sets of output parameter values. An output parameter delta is calculated. The output parameter delta is the difference between the predicted value of the output parameter and a target value of the output parameter. A process recipe offset is calculated by evaluating a second equation at the output parameter delta. The second equation is derived from the plurality of selectable process recipes and the plurality of corresponding output parameter values. An optimal process recipe is selected from the plurality of selectable process recipes by adding the process recipe offset to the target process recipe to compensate the output parameter and to thereby reduce the variation of the output parameter in the manufacture of the integrated circuit device.

BRIEF DESCRIPTION OF THE DRAWINGS

In the accompanying drawings forming a material part of this description, there is shown.

DESCRIPTION OF THE PREFERRED EMBODIMENTS

The embodiments disclose a method to reduce variation in the array threshold voltage of a DRAM circuit in the manufacture of an integrated circuit device. It should be clear to those experienced in the art that the present invention can be applied and extended without deviating from the scope of the present invention.

The present invention in its preferred embodiment reduces the array threshold variation of the DRAM cell. It is found that several parameters are closely linked to variations in threshold voltage. Each of the parameters can be varied to measure the sensitivity of $V_t$ to normal statistical variation in the parameter.

Figure 1:
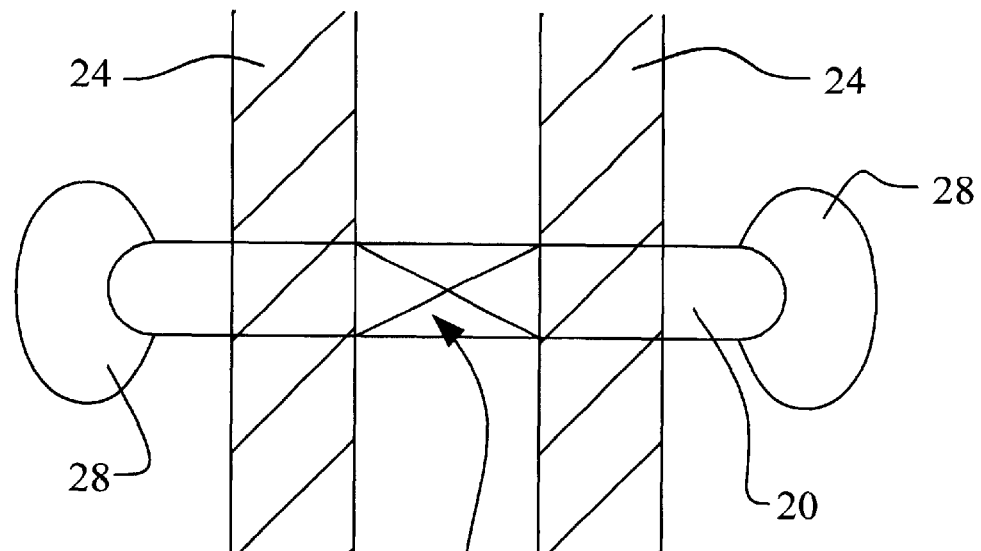
FIG. 1 illustrates in top view a prior art DRAM cell.
Figure 2:
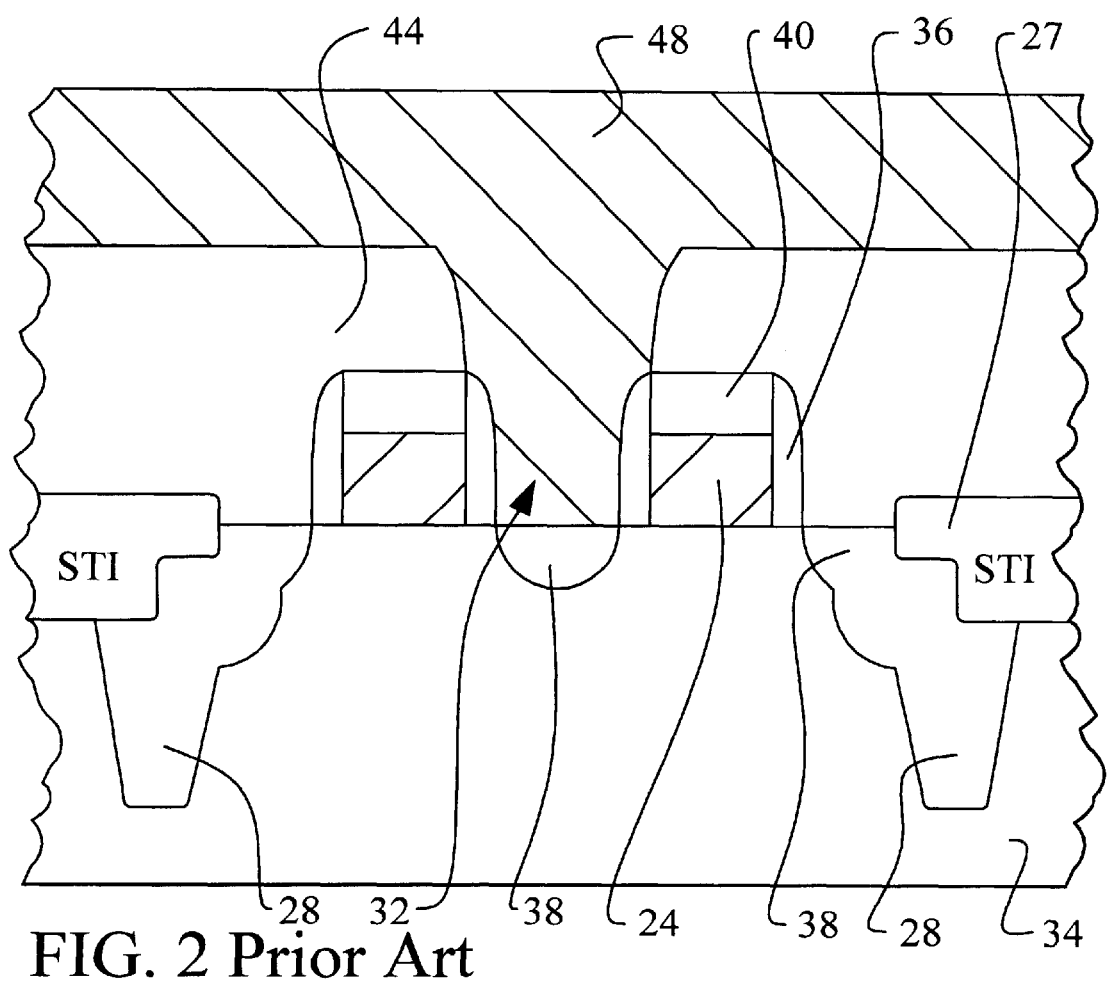
FIG. 2 illustrates in cross section the prior art DRAM cell.
Figure 3:
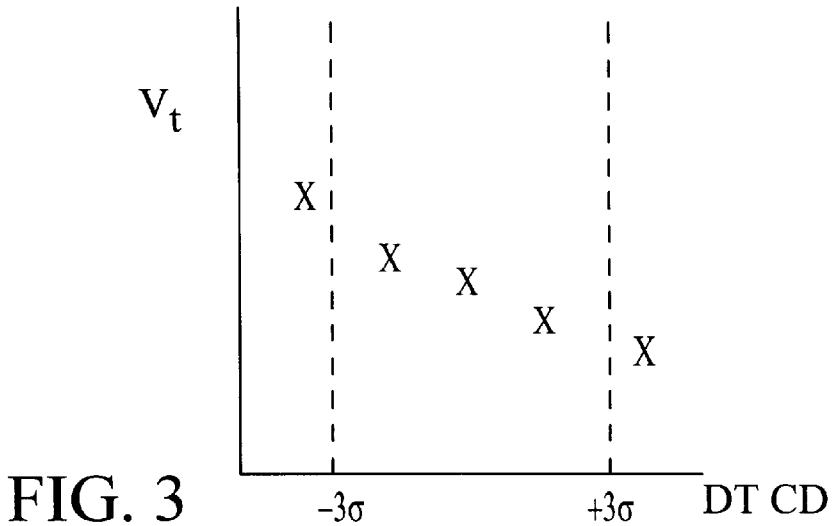
FIGS. 3 through 7 graphically illustrate array threshold voltage variation for several key parameters.

Referring now particularly to FIG. 3, it is found that $V_t$ decreases as the critical dimension of the deep trench (DT CD) of the trench capacitor increases. As the DT CD value sweeps across the $\pm 3\sigma$ range that represents a normal processing distribution for this parameter, the $V_t$ value displays a sensitivity to this variation. Studies of parametric sensitivity for various factors can be performed during the piloting phase for an integrated circuit product or process.

Figure 4:
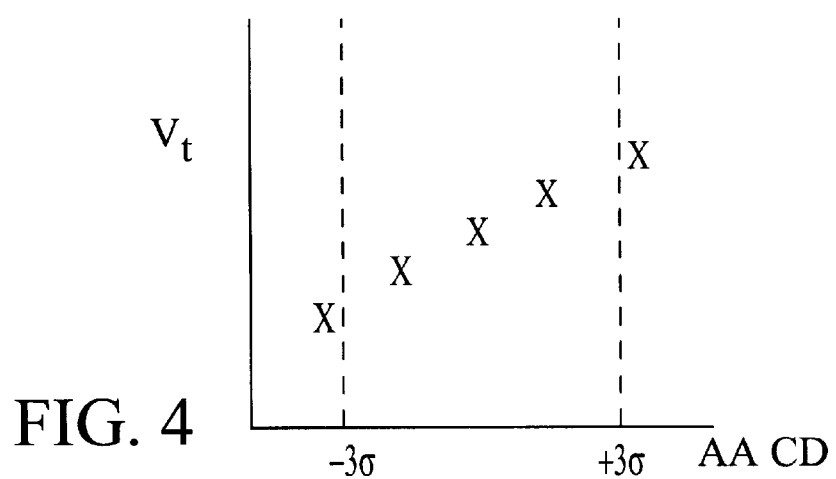
Figure 5:
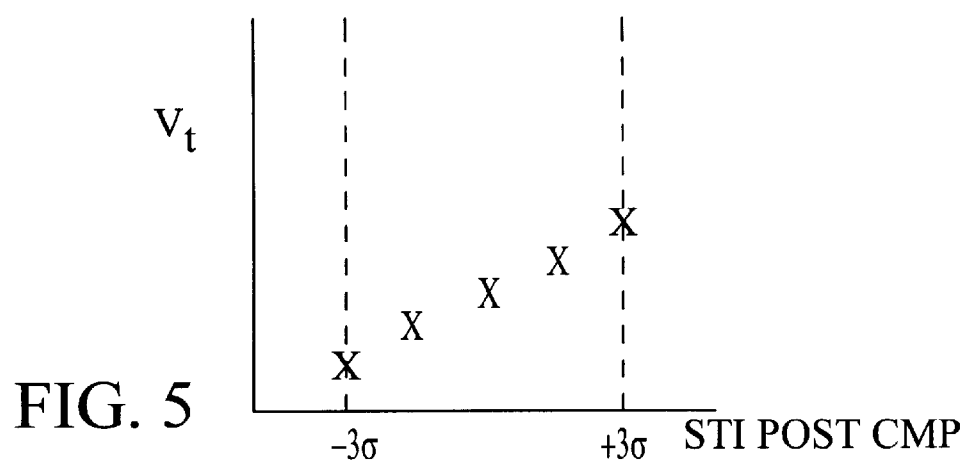
Figure 6:
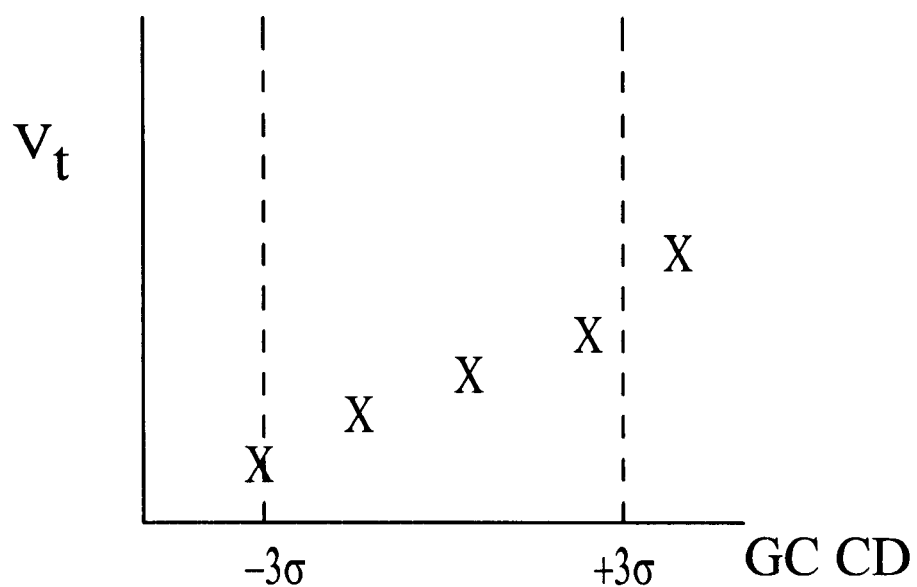
Figure 7:
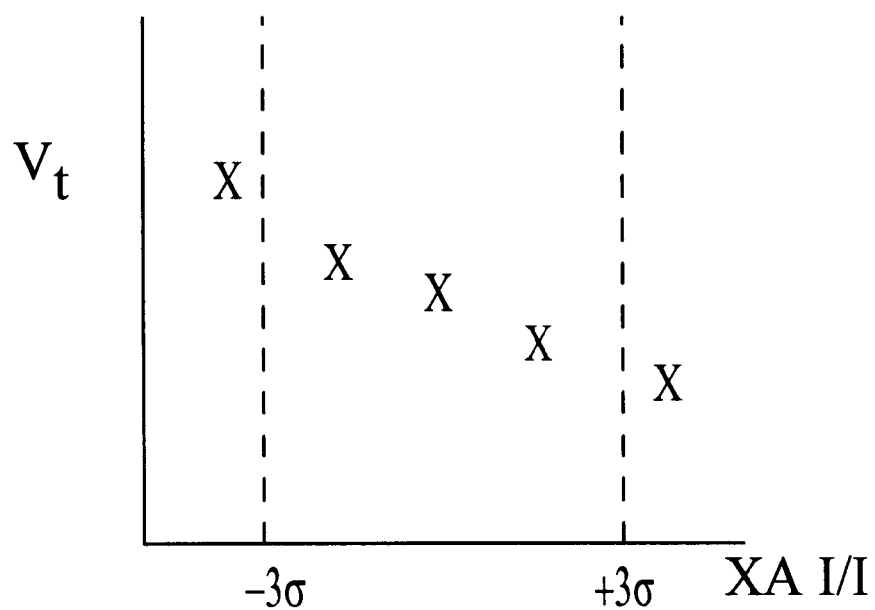

Referring now to FIGS. 4 through 7, the sensitivity charts for several additional parametric factors are depicted. FIG. 4 illustrates the proportionality between $V_t$ and the active area CD (AA CD) measurement. FIG. 5 illustrates proportionality between the STI silicon dioxide fill layer thickness after the CMP step (STI POST CMP) and the array $V_t$. FIG. 6 demonstrates the relationship between the gate conductor line CD (GC CD) and the array $V_t$. Finally, FIG. 7 illustrates the inverse relationship between the source/drain ion implantation (XA I/I) and the threshold voltage. The particular parameters depicted in FIGS. 3 through 7 have been identified as key processes for the control of the array $V_t$.

Most significantly, it is found that the relationships between these several parametric factors and the final array $V_t$ of the DRAM can be modeled in a single, predictive equation. Further, it is found that this predictive model can be combined with a second equation to select the optimum source/drain ion implantation (XA I/I) to compensate for process variations and to adjust the array $V_t$ toward the target value.

Production lot data has revealed that the array $V_t$ can be modeled in a linear equation with the aforementioned parameters of DT CD, AA CD, STI POST CMP, GC CD, and XA I/I as independent variables. Of these parameters, the XA I/I parameter is separated into a second equation so that this parameter can be used to optimize the array $V_t$.

The first equation takes the general form of:

$$OP_{predicted} = X_0 + X_1(P_{1M} - P_{1T}) + X_2(P_{2M} - P_{2T}) + \ldots + X_n(P_{nM} - P_{nT}),$$

where $OP_{predicted}$ is the predicted value of the output parameter, $X_0$ through $X_n$ are derived constants, $P_{1M}$ through $P_{nM}$ are the present set of process parameter values, and $P_{1T}$ through $P_{nT}$ are the target values for the set of process parameters.

In particular, the array threshold voltage may be modeled as:

$$V_{Tpredicted} = X_0 + X_1(DT - DT_0) + X_2(AA - AA_0) + X_3(STI - STI_0) = X_4(GC - GC_0),$$

where $V_{Tpredicted}$ is the predicted value of the array threshold voltage ($V_t$), $X_0$ through $X_4$ are derived constants based on a substantial number of production runs, and DT, AA, STI, and GC are the present set of process parameter values measured from the integrated circuit wafer. $DT_0$, $AA_0$, $STI_0$, and $GC_0$ are the target values for the set of process parameters. The present set of process parameter values are those values measured from the particular integrated circuit wafer prior to the source/drain ion implantation step. The novel first equation allows the impact of variation of key parameters to be seen in variation in the predicted threshold voltage.

Figure 8:
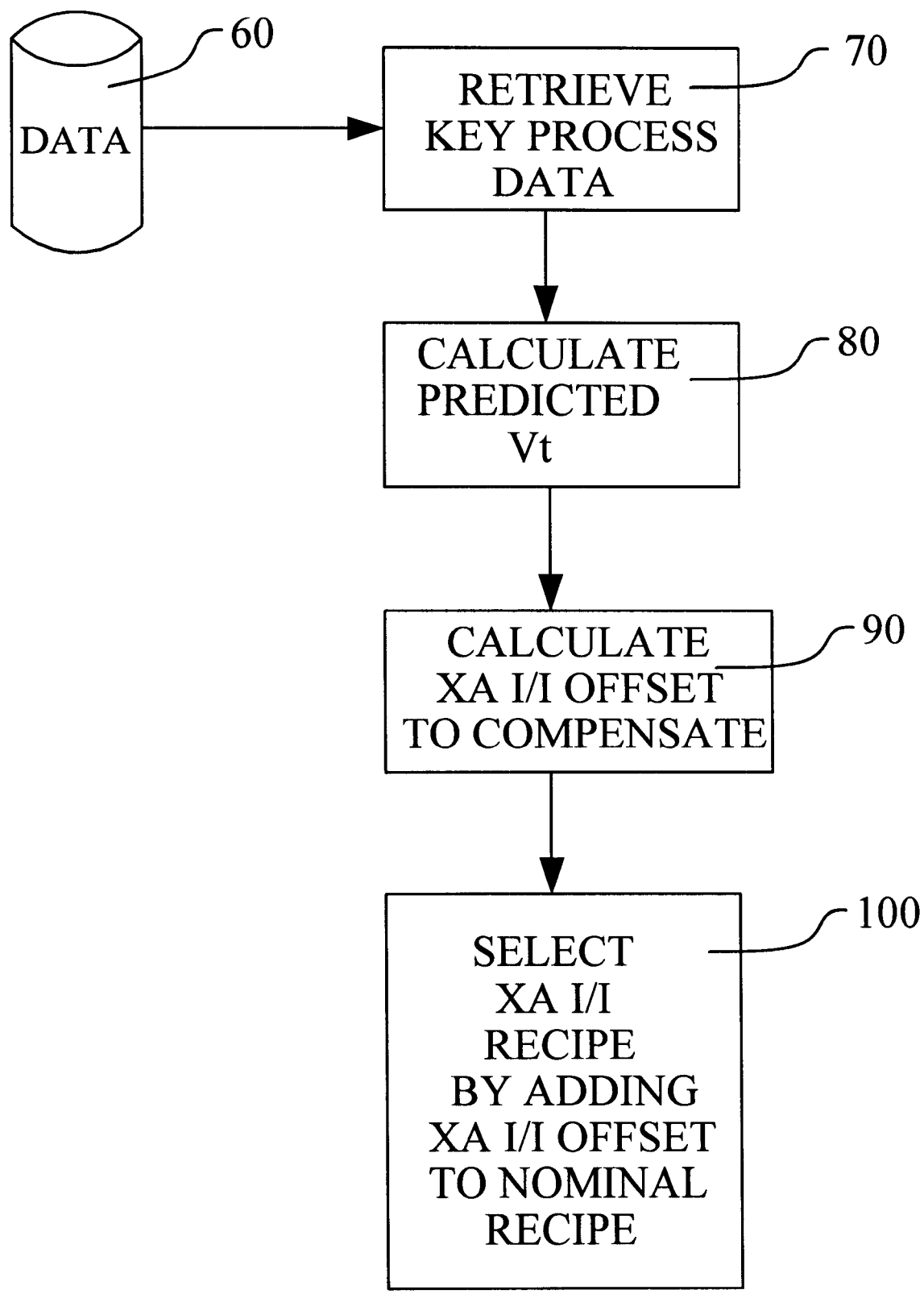
FIG. 8 illustrates a flow chart of the preferred embodiment of the present invention.

Referring now to FIG. 8, the present set of process parameter values is retrieved from data storage 60 as shown in step 70. These values may be stored in a manufacturing information system (MIS). In the preferred embodiment, the MIS, such as the PROMIS system, is used for storing the present set of process parameter values and for storing selectable process recipes. In addition, the MIS is used for the evaluation of the first and second equations.

The first equation is evaluated with the present set of process parameter values to create the predicted array $V_t$ as shown in step 80.

An output parameter delta may now be calculated. The output parameter delta is simply the difference between the target output parameter value and the predicted output parameter value. In the example case of the array $V_t$, the array threshold voltage ($V_t$) delta is the difference between the predicted value of the array threshold voltage and the target value of the array threshold voltage.

Once the output parameter delta is calculated, a second equation may be evaluated. A process recipe offset is calculated by evaluating a second equation at the output parameter delta. This second equation is derived from the plurality of selectable process recipes and the plurality of corresponding output parameter values. This second equation is of the form: $\Delta PR = Y(\Delta OP)$, where $\Delta PR$ is the process recipe offset, Y is a derived constant, and $\Delta OP$ is the output parameter delta. The plurality of selectable process recipes is defined as the set of all the process recipes that can be run on the product at this process step. In the typical process step, the process recipe is held constant from lot-to-lot. However, the novel approach of the present invention allows a selected process recipe to be altered to correct for lot-to-lot variation in key parameters that would otherwise cause excessive variation in the controlled output parameter.

In the particular case of the array $V_t$, a source/drain ion implantation recipe offset is calculated by evaluating a second equation at the array threshold voltage ($V_t$) delta. The second equation is derived from the plurality of selectable source/drain ion implantation recipes and the plurality of corresponding array threshold voltage ($V_t$) values caused by variation in the source/drain implantation. This second equation is of the form: $\Delta PR = Y(\Delta V_T)$, where $\Delta PR$ is said source/drain ion implantation recipe offset, Y is a derived constant, and $\Delta V_T$ is the array threshold voltage ($V_t$) delta. This calculation is performed in step 90 of FIG. 8. Note that the product of this calculation is not a particular process recipe but an offset or adjustment of the typical or nominal recipe for this process step.

An optimal process recipe is now selected from the plurality of selectable process recipes by adding the process recipe offset to the target process recipe. By making this adjustment in the target process recipe, the variation of the output parameter is thereby reduced. In the example case, an optimal source/drain ion implantation recipe is selected from the plurality of selectable source/drain ion implantation recipes by adding the source/drain ion implantation recipe offset to the target or nominal source/drain ion implantation recipe. This adjusted target recipe compensates for earlier process variations to thereby correct the final measured $V_t$ value. Variation of the array threshold voltage ($V_t$) in the manufacture of the integrated circuit device is thereby reduced. The selection of the optimum recipe is performed in step 100 of FIG. 7.

As an option to the preferred embodiment of the present invention, a maximum recipe correction may be implemented. In this case, if the recipe compensation required by the predictive calculation is so large that the recipe would create a secondary parametric problem, a second additional process step may needed. For example, if the change in the source/drain ion implantation recipe required to adjust the $V_t$ value is so large that it adversely affects the sheet resistance of the source/drain region, then a second ion implantation may be needed. The second ion implantation could use an alternative depth or energy, for example to correct the threshold value while the first ion implantation provides an adequate source/drain concentration.

As shown in the preferred embodiments, the method of the present invention provides a means of reducing a process output parameter variation caused by other measurable parameters. In the preferred embodiment, the method is applied to the reduction of array $V_t$ variation in a DRAM circuit. The method uses two equations to first predict and to then correct the threshold voltage to reduce variation.

While the invention has been particularly shown and described with reference to the preferred embodiments thereof, it will be understood by those skilled in the art that various changes in form and details may be made without departing from the spirit and scope of the invention.

What is claimed is:

1. A method to reduce variation of an output parameter by selection of an optimal process recipe in the manufacture of an integrated circuit device comprising:

measuring an integrated circuit device wafer prior to performing a current process step to obtain a present set of process parameter values;

thereafter calculating a predicted value of an output parameter by evaluating a first equation at said present set of process parameter values wherein said first equation is derived from a plurality of previous sets of process parameter values and the corresponding plurality of sets of output parameter values;

thereafter calculating an output parameter delta wherein said output parameter delta is the difference between said predicted value of said output parameter and a target value of said output parameter;

thereafter calculating a process recipe offset by evaluating a second equation at said output parameter delta wherein said second equation is derived from the plurality of selectable process recipes and the plurality of corresponding output parameter values; and selecting an optimal process recipe for said current process step and said integrated circuit device wafer from said plurality of selectable process recipes by adding said process recipe offset to a target process recipe to thereby reduce the variation of said output parameter in the manufacture of the integrated circuit device.

2. The method according to claim 1 wherein said integrated circuit device comprises a DRAM circuit.

3. The method according to claim 2 wherein said output parameter comprises the threshold voltage ($V_t$) of memory array transistors.

4. The method according to claim 1 wherein said set of process parameter values comprises one of the group of: deep trench critical dimension (DT CD), active area critical dimension (AA CD), shallow trench oxide thickness after chemical mechanical polish (STI POST CMP), gate conductor critical dimension (GC CD), and combinations thereof.

5. The method according to claim 1 wherein said first equation is of the form: $OP_{predicted}=X_0+X_1(P_{1M}-P_{1T})+X_2(P_{2M}-P_{2T})+\ldots+X_n(P_{nM}-P_{nT})$, and wherein $OP_{predicted}$ is said predicted value of output parameter, $X_0$ through $X_n$ are derived constants, $P_{1M}$ through $P_{nM}$ are said present set of process parameter values, and $P_{1T}$ through $P_{nT}$ are the target values for said set of process parameters.

6. The method according to claim 1 wherein said second equation is of the form: $\Delta PR=Y(\Delta OP)$, and wherein $\Delta PR$ is said process recipe offset, Y is a derived constant, and $\Delta OP$ is said output parameter delta.

7. The method according to claim 1 wherein said process recipe comprises a source/drain ion implantation.

8. The method according to claim 1 further comprising adding an additional processing step if said process recipe offset exceeds a specified value.

9. The method according to claim 1 wherein a manufacturing information system (MIS) is used to store said present set of process parameter values and said plurality of selectable process recipes and is used to evaluate said first equation and said second equation.

10. A method to reduce variation of an output parameter by selection of an optimal process recipe in the manufacture of an integrated circuit device comprising:

measuring an integrated circuit device wafer to obtain a present set of process parameter values;

thereafter calculating a predicted value of an output parameter by evaluating a first equation at said present set of process parameter values wherein said first equation is derived from a plurality of previous sets of process parameter values and the corresponding plurality of sets of output parameter values, wherein said first equation is of the form: $OP_{predicted}=X_0+X_1(P_{1M}-P_{1T})+X_2(P_{2M}-P_{2T})+\ldots+X_n(P_{nM}-P_{nT})$, and wherein $OP_{predicted}$ is said predicted value of output parameter, $X_0$ through $X_n$ are derived constants, $P_{1M}$ through $P_{nM}$ are said present set of process parameter values, and $P_{1T}$ through $P_{nT}$ are the target values for said set of process parameters;

thereafter calculating an output parameter delta wherein said output parameter delta is the difference between said predicted value of said output parameter and a target value of said output parameter;

thereafter calculating a process recipe offset by evaluating a second equation at said output parameter delta wherein said second equation is derived from the plurality of selectable process recipes and the plurality of corresponding output parameter values, wherein said second equation is of the form: $\Delta PR=Y(\Delta OP)$, and wherein $\Delta PR$ is said process recipe offset, Y is a derived constant, and $\Delta OP$ is said output parameter delta; and selecting an optimal process recipe from said plurality of selectable process recipes by adding said process recipe offset to a target process recipe to thereby reduce the variation of said output parameter in the manufacture of the integrated circuit device.

11. The method according to claim 10 wherein said integrated circuit device comprises a DRAM circuit.

12. The method according to claim 10 wherein said output parameter comprises the threshold voltage ($V_t$) of memory array transistors.

13. The method according to claim 10 wherein said set of process parameter values comprises one of the group of: deep trench critical dimension (DT CD), active area critical dimension (AA CD), shallow trench oxide thickness after chemical mechanical polish (STI POST CMP), gate conductor critical dimension (GC CD), and combinations thereof.

14. The method according to claim 10 wherein said process recipe comprises a source/drain ion implantation.

15. The method according to claim 10 further comprising adding an additional processing step if said process recipe offset exceeds a specified value.

16. The method according to claim 10 wherein a manufacturing information system (MIS) is used to store said present set of process parameter values and said plurality of selectable process recipes and is used to evaluate said first equation and said second equation.

17. A method to reduce variation of the array threshold voltage ($V_t$) of a DRAM circuit by selection of an optimal process recipe in the manufacture of an integrated circuit device comprising:

measuring an integrated circuit device wafer to obtain a present set of process parameter values;

thereafter calculating a predicted value of the array threshold voltage ($V_t$) by evaluating a first equation at said present set of process parameter values wherein said first equation is derived from a plurality of previous sets of process parameter values and the corresponding plurality of sets of the array threshold voltage ($V_t$), wherein said first equation is of the form: $V_{Tpredicted} = X_0 + X_1(P_{1M} - P_{1T}) + X_2(P_{2M} - P_{2T}) + \ldots + X_n(P_{nM} - P_{nT})$, and wherein $V_{Tpredicted}$ is said predicted value of said array threshold voltage ($V_t$), $X_0$ through $X_n$ are derived constants, $P_{1M}$ through $P_{nM}$ are said present set of process parameter values, and $P_{1T}$ through $P_{nT}$ are the target values for said set of process parameters;

thereafter calculating an array threshold voltage ($V_t$) delta wherein said array threshold voltage ($V_t$) delta is the difference between said predicted value of said array threshold voltage ($V_t$) and a target value of said array threshold voltage ($V_t$);

thereafter calculating a source/drain ion implantation recipe offset by evaluating a second equation at said array threshold voltage ($V_t$) delta wherein said second equation is derived from the plurality of selectable source/drain ion implantation recipes and the plurality of corresponding array threshold voltage ($V_t$) values, wherein said second equation is of the form: $\Delta PR = Y(\Delta V_T)$, and wherein $\Delta PR$ is said source/drain ion implantation recipe offset, Y is a derived constant, and $\Delta V_T$ is said array threshold voltage ($V_t$) delta; and selecting an optimal source/drain ion implantation recipe from said plurality of selectable source/drain ion implantation recipes by adding said source/drain ion implantation recipe offset to a target source/drain ion implantation recipe to thereby reduce the variation of said array threshold voltage ($V_t$) in the manufacture of the integrated circuit device.

18. The method according to claim 17 wherein said set of process parameter values comprises one of the group of: deep trench critical dimension (DT CD), active area critical dimension (AA CD), shallow trench oxide thickness after chemical mechanical polish (STI POST CMP), gate conductor critical dimension (GC CD), and combinations thereof.

19. The method according to claim 17 further comprising adding an additional processing step if said source/drain ion implantation recipe offset exceeds a specified value.

20. The method according to claim 17 wherein a manufacturing information system (MIS) is used to store said present set of process parameter values and said plurality of selectable source/drain ion implantation recipes and is used to evaluate said first equation and said second equation.

* * * * *